INVENTOR
L. U. KIBLER
BY
Sylvan Sherman
ATTORNEY

SOLID STATE DIODE SURFACE WAVE TRAVELING WAVE AMPLIFIER

Filed Nov. 9, 1961 4 Sheets-Sheet 2

INVENTOR
L. U. KIBLER
BY
Sylvan Sherman
ATTORNEY

INVENTOR
L. U. KIBLER
BY
Sylvan Sherman
ATTORNEY

SOLID STATE DIODE SURFACE WAVE TRAVELING WAVE AMPLIFIER

Filed Nov. 9, 1961 4 Sheets-Sheet 4

INVENTOR
L.U. KIBLER
BY
Sylvan Sherman
ATTORNEY

United States Patent Office 3,094,664

Patented June 18, 1963

3,094,664

SOLID STATE DIODE SURFACE WAVE TRAVELING WAVE AMPLIFIER

Lynden U. Kibler, Middletown, N.J., assignor to Bell Telephone Laboratories, Incorporated, New York, N.Y., a corporation of New York Filed Nov. 9, 1961, Ser. No. 151,304
15 Claims. (Cl. 325—373)

This invention relates to solid state, high frequency devices and, more particularly, to high frequency surface-wave transmission line amplifiers, oscillators and frequency converters.

Low noise amplification at microwave frequencies has for many years been exclusively achieved by means of vacuum tube amplifiers. Recently, however, amplifiers using various types of solid state devices as the active element have been developed which in many respects are superior to the prior art vacuum tube devices.

One class of solid state amplifier utilizes as the active element a diode having a nonlinear capacitance. In such amplifiers the diode is suitably disposed within a wave path and under the proper conditions converts energy from a pumping wave to a suitably related signal wave. The operation of this type of parametric amplifier is described by E. D. Reed in an article entitled "The Variable-Capacitance Parametric Amplifier," published in the October 1959 Bell Telephone Laboratories Record, vol. 37, No. 10, pages 373 to 379. In the copending application of B. C. De Loach, Serial No. 75,232, filed December 12, 1960, now Patent No. 3,050,689, there is disclosed an amplifier using a tunnel diode as the active element.

In the specific embodiment of the prior art amplifiers described by Reed and De Loach, the active element is inserted in a hollow, conductively bounded waveguide. In United States Patent 2,978,649, issued to M. T. Weiss, there is described a variable reactance parametric amplifier using magnetically biased gyromagnetic material as the active element where such material is located in a composite waveguide and two conductor wave-supporting structure. The above-mentioned transmission media are typical of those used heretofore to produce high-frequency amplification.

The typical high-frequency transmission medium, such as the coaxial cable or hollow waveguide mentioned above, effectively confines the electromagnetic wave energy within an enclosed region of space by the use of conducting walls. In United States Patent 2,659,817, issued to C. C. Cutler on November 17, 1953, there is described a third type of transmission medium in which the propagating wave energy is effectively bound to an exposed surface of the transmission line rather than being confined within a bounded volume. While theoretically the energy distribution associated with such a propagating wave extends throughout all of space, in a well-designed surface-wave line the decrease in amplitude with distance from the transmission medium is rapid and for all practical purposes the wave energy is substantially confined to the region immediately adjacent thereto. Some forms of this type of open transmission line have several advantages over the enclosed region type of transmission line in that they are less bulky and less expensive to build. In addition, since the electromagnetic fields are not confined within small regions of space the field densities can be relatively lower and the resistive and dielectric losses can be correspondingly smaller.

It is, accordingly, an object of this invention to produce high-frequency amplification along surface-wave transmission lines using solid state components as the active element.

In accordance with the principles of the invention, a surface-wave transmission line is converted to a high-frequency amplifier or oscillator by including, at periodic intervals along the line, an active element which can be a nonlinear reactance, such as a varactor diode, or a negative resistance component such as an Esaki diode. The active element is incorporated into the line so as to maintain the proper surface conditions for surface-wave transmission. In addition, where a nonlinear reactance is used, the surface-wave line is simultaneously adjusted to propagate, with the appropriately related phase velocities, pumping frequency wave energy and wave energy at the appropriate side-band in addition to signal frequency wave energy.

In the first embodiment of the invention a corrugated surface-wave line comprising a plurality of alternate metallic and dielectric regions is used. An active element is positioned in some or all of the dielectric regions and electrically connected to the metallic regions adjacent to each of said dielectric regions.

Various other embodiments of the invention are also shown using different types of surface-wave lines. Each line, however, is basically composed of alternate metallic and dielectric regions in which there are incorporated suitable solid state active elements.

These and other objects and advantages, the nature of the present invention and its various features, will appear more fully upon consideration of the various illustrative embodiments now to be described in detail in connection with the accompanying drawings, in which.

Figure 1:
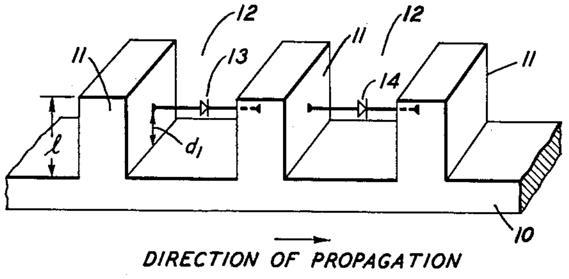
FIG. 1 shows a portion of a corrugated surface-wave line adapted to produce parametric amplification.

Referring to FIG. 1 of the drawing, there is shown, by way of example, a portion of a corrugated surface-wave transmission line comprising an extended conductive surface 10 which can be planar, as illustrated, or curved, upon which there are located an alternate series of metallic and dielectric regions. The metallic regions comprise the transversely extending ridges 11. The dielectric regions comprise the slots 12 between adjacent ridges.

The general theory of surface-wave transmission lines indicates that a corrugated surface is capable of supporting and propagating electromagnetic wave energy if the slots 12 provide a series inductive loading at the surface. This requires that the slot depth $l$ be less than a quarter wavelength, or, more generally, it requires that $$2n\left(\frac{\lambda}{4}\right)<l<(2n+1)\frac{\lambda}{4}$$

Since the slot length is a function of frequency, the propagation characteristics of the surface-wave line exhibit discrete pass bands. The first stop band occurs when the slot which is, in effect, a shorted length of waveguide, becomes a quarter wavelength long. Where the depth $l$ of the slot is less than a quarter wavelength, $$\left(l<\frac{\lambda}{4}\right)$$

the input impedance across the slot is inductive and the structure is supportive of a traveling surface wave which is capable of propagating in a direction perpendicular to the direction of the corrugations with a phase velocity $v$. The magnitude of the phase velocity is dependent upon the slot depth, and varies from the free-space velocity for zero depth, to zero velocity for a slot depth of one-quarter wavelength. The intensity of the electric and magnetic fields associated with the wave energy (as measured along a line normal to the surface) also depends upon the slot depth. For a shallow slot there is only a small exponential decrease in the field intensities. For slot depths approaching a quarter wavelength, the exponential decrease becomes large.

Figures 2, 3:
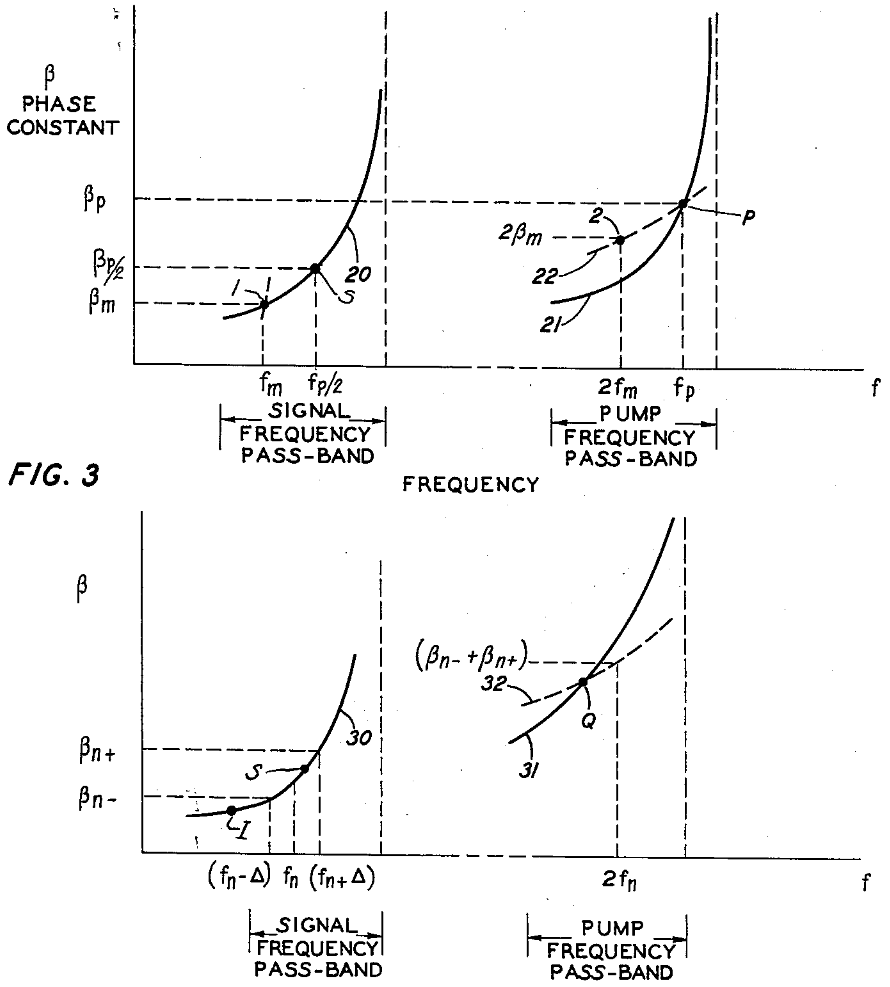
FIGS. 2 and 3 show, by way of illustration, the manner in which the phase constant of a surface-wave transmission line varies as a function of frequency and further illustrates the manner in which an amplifier in accordance with the invention can be graphically designed.

In a paper by D. Marcuse, entitled "A New Type of Surface-Wave Transmission Line With Bandpass Properties," published in the Archiv der Elektuschen Ubertragungen, vol. 11, No. 4, April 1957, pages 146 to 148, the variation in phase constant of a disk-type surface-wave transmission line is given as a function of frequency, and curves such as those shown in FIG. 2 are obtained. Curves of this general type are typical of the bandpass characteristic of surface-wave transmission lines.

In accordance with the invention, a surface-wave transmission line of the general type described above, is converted into a traveling wave amplifier by the incorporation into such a line of a suitable solid state active element. This can take the form of a suitably connected voltage sensitive capacitance, such as a varactor diode, or a diode of the type first described by Leo Esaki in an article entitled "New Phenomenon in Narrow Germanium p-n Junctions," published in the January 15, 1958, Physical Review, No. 109, pages 603 to 604 (also see "Tunnel Diodes" in May 1960 Electrical Design News, page 50), or, more generally, it can be any device of suitable size having either a nonlinear reactance or a current versus voltage characteristic which includes a negative resistance region.

In the embodiment of FIG. 1, there are shown a pair of substantially similar diodes 13 and 14 positioned in successive dielectric regions of the line and electrically connected to two adjacent metallic ridges. The term "electrically" connected, as used herein, shall be understood to means either "conductively" connected or "reactively" connected. The latter arrangement is generally used in conjunction with a biasing arrangement to permit the application of a biasing voltage to the negative resistance element without substantially interfering with the high-frequency wave path. For the purposes of the following discussion, it is assumed that diodes 13 and 14 are voltage sensitive, variable capacitance diodes and that the embodiment of FIG. 1 is a portion of a surface-wave negative resistance parametric amplifier.

To realize parametric amplification, it is necessary that the portion of diode-loaded surface-wave transmission line shown in FIG. 1 be supportive simultaneously of a pumping wave of frequency $f_p$, a signal wave of frequency $f_s$, and an idler wave of frequency $f_i$ such that $$f_i+f_s=f_p \qquad (1)$$

It is, in addition, highly preferred for optimum efficiency, though it is not essential to produce amplification, that the phase constants $\beta_p$, $\beta_s$ and $\beta_i$ for the three waves also be related such that $$\beta_s+\beta_i=\beta_p \qquad (2)$$

It is also preferable in the negative resistance parametric amplifier that the upper side-band at a frequency $f_p+f_s$ not be propagated and, accordingly, the structure is advantageously designed to suppress the upper side-band.

Accordingly, in a preferred embodiment of the invention, the diodes 13 and 14 are incorporated into the surface-wave line in such a way as to realize the line requirements set forth above, and, in addition, to provide some net gain per slot at the signal frequency.

A varactor diode can be represented by a parallel combination of capacitances, one of which is constant (C) and the other of which varies as a function of the voltage across the diode terminals ($\Delta C(v)$). Each of the diodes 13 and 14, therefore, has a total capacitance $C_t$ which is a function of a voltage ($v$) given by $$C_t(v)=C+\Delta C(v) \qquad (3)$$

While the diodes can be placed anywhere within slots 12, they are advantageously placed a distance $d_1$ from the shorted end of the slot at a point where the inductance L of the slot is sufficient to resonate the constant portion of the diode conductance C at the signal frequency. When viewed at the top, each slot now appears to the signal as a section of line of length $(l-d_1)$ terminated in a variable capacitor $\Delta C(v)$.

In accordance with the requirements for surface-wave propagation, the length $(l-d_1)$ is selected such that the slots appear inductive at the frequencies of interest. However, since the capacitance $\Delta C(v)$ terminating the length of slot $(l-d_1)$ is variable as a function of the voltage applied across its terminals, so is the equivalent inductance across each of the slots. Thus, under the influence of a pumping wave, the amplitude of the slot inductance is modulated at the pumping frequency.

P. K. Tien and H. Suhl have shown in an article entitled "A Traveling-Wave Ferromagnetic Amplifier," published in the April 1958 issue of the Proceedings of the Institute of Radio Engineers, pages 700 to 706, that under the influence of a pumping wave of frequency $f_p$, a variable inductance appears to a lower frequency signal wave of frequency $f_s$ and at the difference (idler) frequency $f_i$, as a negative resistance. This then establishes the two conditions necessary for surface-wave parametric amplification. First, each slot appears inductive to the pumping wave and to the signal and idler waves. Second, each slot has a negative resistance, $-R$, at the signal and idler frequencies. This provides a gain per slot G equal to $$\frac{Z_0}{Z_0+(-R)}$$

where $Z_0$ is the characteristic impedance of the diode-loaded surface waveguide.

Knowing the properties of the varactor diode and the slot dimensions, the location of the diode within the slot can be readily calculated so that the diode-loaded surface-wave transmission line propagates wave energy over a range of frequencies which includes the signal, the idler and the pumping frequencies but excludes the upper side-band frequency. Curves, such as those shown in FIG. 2, can then be calculated or obtained empirically. Curve 20 of FIG. 2 shows the variation of phase constant $\beta$ as a function of frequency over a range of frequencies which includes the signal and idler frequencies. Curve 21 shows the variation of phase constant $\beta$ as a function of frequency over a range of frequencies which includes the pumping frequency.

To obtain an optimum operating point which simultaneously satisfies Equations 1 and 2, curve 20 is replotted by doubling all values of frequency and phase constant to obtain a second curve 22. For example, a point 1 on curve 20 at a frequency $f_m$ and a phase constant $\beta_m$ is replotted as a point 2 on curve 22 at frequency $2f_m$ and phase constant $2\beta_m$. The point P at which curve 22 intersects curve 21 defines a point on curve 21 ($f_p$, $\beta_p$) and a corresponding point on curve 20

$$\left(\frac{f_p}{2}, \frac{\beta_p}{2}\right)$$

which simultaneously satisfies Equations 1 and 2 for the degenerate mode of operation in which the signal and idler frequencies are substantially identical.

To determine an optimum operating point for the nondegenerate mode of operation, a slightly different procedure is used. Referring to curve 30 in FIG. 3, a frequency $f_n$ and two frequencies $f_n-\Delta$ and $f_n+\Delta$ corresponding to a signal and an idler frequency are selected where $2\Delta$ is the desired separation between the signal and idler frequencies. For frequencies $f_n-\Delta$, there is a corresponding phase constant $\beta_{n-}$ given by curve 30 and for frequency $f_n+\Delta$ there is a corresponding phase constant $\beta_{n+}$. Curve 32 is obtained by plotting the sum of the phase constants $(\beta_{n+}+\beta_{n-})$ as a function of the sum of the frequencies $[(f_n+\Delta)+(f_n-\Delta)]$. The intersection Q of curve 32 with curve 31 defines the operating point for parametric amplification in the nondegenerate mode. That is, point Q defines a point on curve 31 $(f_p, \beta_p)$ and a corresponding pair of points S and I on curve 30

$$\left(\frac{f_p}{2}-\Delta, \frac{\beta_{p-}}{2}\right) \text{ and } \left(\frac{f_p}{2}+\Delta, \frac{\beta_{p+}}{2}\right)$$

which satisfies Equations 1 and 2 for the nondegenerate mode of operation as follows:

$$\frac{\beta_{p-}}{2}+\frac{\beta_{p+}}{2}=\beta_p$$

$$\left(\frac{f_p}{2}-\Delta\right)+\left(\frac{f_p}{2}+\Delta\right)=f_p$$

where $$\frac{\beta_{p-}}{2}, \frac{f_p}{2}-\Delta \text{ and } \frac{\beta_{p+}}{2}, \frac{f_p}{2}+\Delta$$

corresponds to the signal and idler phase constants and frequencies.

When the so-called Esaki diode or tunnel diode is used, the design of an amplifier in accordance with the invention is substantially simplified since no pumping signal nor idler signal need be considered. This is so since the current-voltage characteristic of the Esaki diode includes a negative resistance region in its forward characteristic and, if biased within or near this region, is capable of producing a negative resistance directly, without the need of a pumping wave.

An Esaki diode when suitably biased can be represented as a parallel combination of a capacitance and a negative resistance. While the Esaki diode, as indicated above, can be placed anywhere within slot 12, it is also advantageously placed a distance $d_1$ from the shorted end of the slot at a point where the inductance L of the slot is sufficient to resonate the diode capacitance at the signal frequency. When viewed at the open end, each slot now appears as a section of line of length $(l-d_1)$ terminated in a negative resistance. In accordance with the requirements for surface-wave propagation, the length $(l-d_1)$ is selected such that the slot appears inductive at the signal frequency. The negative resistance appears at the open end of the slot as the negative resistance of the diode, transformed through the length of line $(l-d_1)$. This then establishes the two conditions necessary for surface-wave amplification as indicated above.

The surface-wave transmission line shown in FIG. 1 is merely illustrative of only one of many possible types of surface-wave transmission lines. In the above-mentioned article by D. Marcuse, a surface-wave line comprising an array of conductively insulated metallic disks is described. Various other types of surface-wave lines are disclosed by C. C. Cutler in United States Patent 2,659,817, issued November 17, 1953, and by Walter Rotman in an article published in the Proceedings of the Institute of Radio Engineers of August 1951 entitled, "A Study of Single-Surface Corrugated Guides." It is, accordingly, to be understood that the principles of the invention are not limited to any particular type of surface-wave line but can be applied to any or all of these various surface-wave transmission lines as will be illustrated hereinafter.

Figure 4:
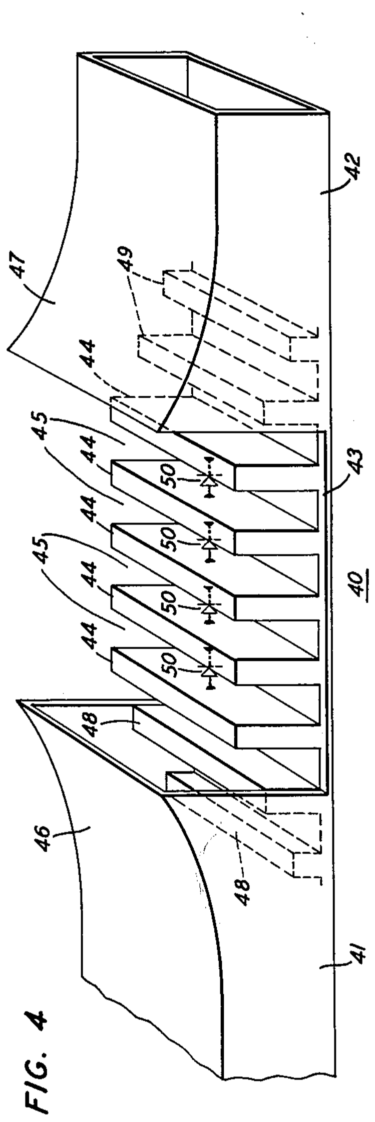
FIGS. 4, 5 and 6 show various embodiments of the invention using different types of surface-wave transmission lines.
Figure 5:
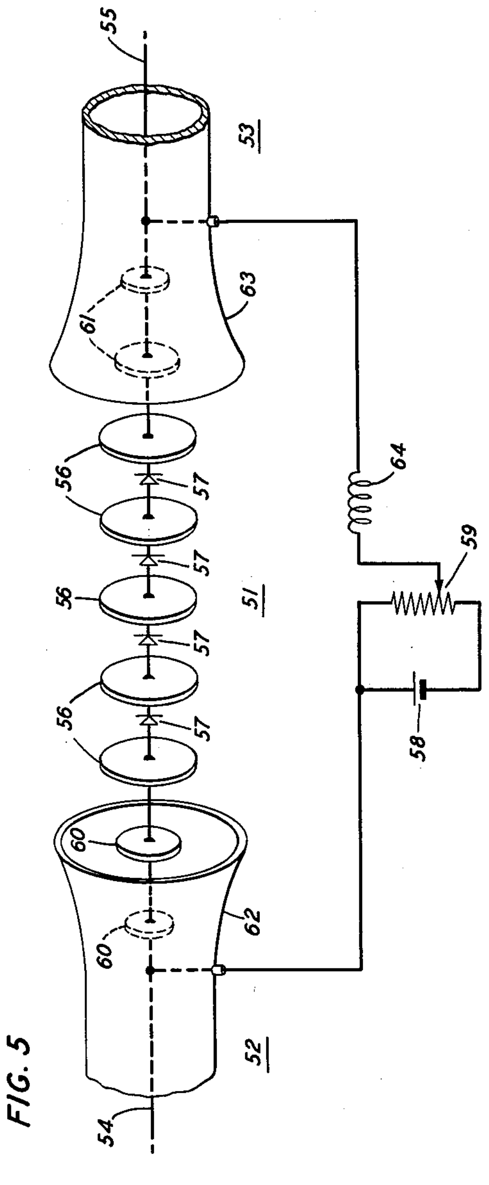
Figure 6:
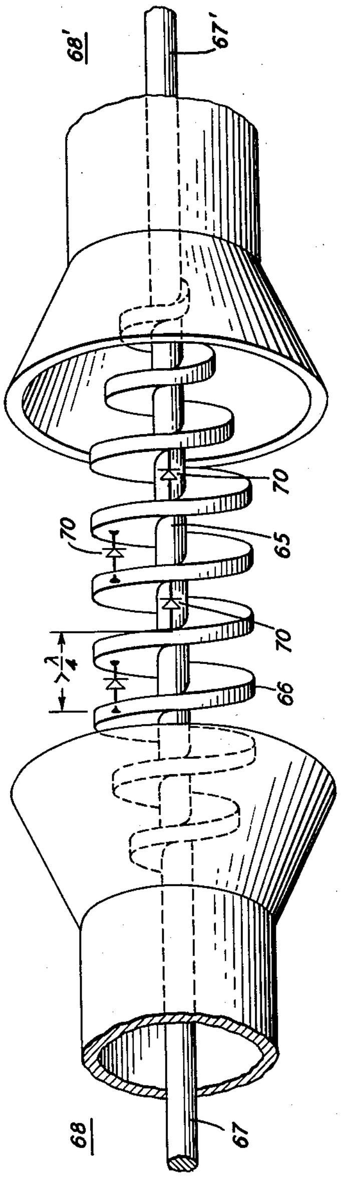

FIGS. 4 through 6 are illustrative of various specific embodiments of the invention designed to operate in accordance with the principles described in detail hereinabove. Each of the embodiments comprises some form of surface-wave transmission line and some form of negative resistance producing means. It is to be understood throughout that any of the various embodiments can use a nonlinear reactance (such as a varactor) to produce a negative resistance provided the line is designed to be supportive of an idler frequency wave and a pumping frequency wave as well as a signal frequency wave. Alternately, it is to be understood that any of the embodiments can use as the active element a device having an intrinsic negative resistance characteristic (such as a tunnel diode). In the following discussion the generic term "negative resistance element" or "negative resistance producing element" shall be used to indicate that either class of active elements can be used. Where a specific type of active element is to be used, it will be suitably identified.

In FIG. 4 the surface-wave transmission line 40 extends between a pair of hollow, conductively bounded rectangular waveguides 41 and 42 and comprises a planar conductive surface 43 (which is shown as an extension of a lower wide wall of guides 41 and 42) upon which there are located an alternate series of metallic and dielectric regions similar to those shown in FIG. 1. The metallic regions comprise the transversely extending ridges 44 and the dielectric regions comprise the slots 45 between adjacent ridges. Slots 45 can merely comprise air or can be filled with some other suitable low-loss dielectric material.

Wave energy is coupled to and from line 40 from guides 41 and 42 by gradually tapering the ends of the guides to form a pair of horns 46 and 47. In addition, the end ridges 48 and 49 progressively diminish in height as they approach and enter the horn sections 46 and 47, respectively. The use of horns and the tapering of the end ridges are expedients which provide for a smooth transfer of energy between the waveguide mode of propagation and the surface-line mode of propagation.

Located between the uniform height ridges 44 are the negative resistance elements 50 which, as indicated above, can be of the nonlinear reactance type or the negative resistance type. As explained above, if the nonlinear reactance type is used as the active element, the line is designed to propagate a pumping wave and an idler wave in addition to a signal wave. If a negative resistance type of active element is used, the line need only be designed to propagate the signal wave.

In the embodiment of FIG. 5 the surface-wave amplifier 51, which extends between a pair of coaxial cables 52 and 53, comprises an extension of the central conductors 54 and 55 of said cables. More specifically, the surface-wave amplifier comprises a plurality of conductive disks 56 of substantially equal diameter each of which is separated from the next adjacent disk by a negative resistance element 57. The disks can be physically supported by the negative resistance elements 57 or, alternatively, can be supported by separate means such as dielectric spacers (not shown). Coupling to and from amplifier 51 is accomplished by tapering the outer conductors 62 and 63 of coaxial cables 52 and 53, respectively, and by gradually reducing the diameter of the end disks 60 and 61. These latter disks can be conductively connected directly to the inner conductors 54 and 55 as they approach and enter the coaxial cables as shown in FIG. 5 or, if desired, additional negative resistance elements can be inserted between these tapered disks.

The design and operation of a disk type surface-wave line is described by D. Marcuse and W. Rotman in the publications cited above.

In the embodiment of FIG. 5 the negative resistance elements 57 are shown connected to the center of the disks 56. To the progagating surface-waves adjacent pairs of disks appear as a plurality of radial transmission lines terminated by the negative resistance elements 57. The negative resistive elements, however, can be connected to the disks at points other than the disk centers. In this latter arrangement the disks can be otherwise conductively insulated from each other, in which case adjacent pairs of disks appear as open-ended radial lines to the surface wave. Alternately, the disks can be conductively connected to each other at their centers in which case adjacent pairs of disks appear as short-circuited radial lines to the surface wave. It should be noted, however, that the disk diameters required to reflect the necessary inductive reactance at the surface of the line in these two cases are different.

Means for biasing the elements 57 which, typically are diodes, is provided by a source of unidirectional potential 58, a potentiometer 59 and an RF choke 64. One terminal of source 58 is connected to the inner conductor 54 of coaxial line 52 and the other terminal of source 58 is connected to the inner conductor 55 of coaxial line 53 through the potentiometer 59 and the series RF choke 64. By arranging all the negative resistance producing elements in series with the same polarity, a common biasing current is caused to flow through each of them.

In the embodiment of FIG. 6 the disks of FIG. 5 are replaced by a conductive spiral structure comprising a rod 65 and a longitudinally progressing spiral vane 66 which extends radially from rod 65 at every transverse cross-section along its length. (For details of the spiral surface-wave line see the article by W. Rotman cited above.)

Located along the spiral at intervals greater than a quarter wavelength are the negative resistance elements 70, each of which extends parallel to rod 65 from a first point on spiral 66 to a second, longitudinally spaced, corresponding point on the spiral.

Coupling to and from the device is accomplished by connecting the center rod 65 to the center conductors 67 and 67′ of coaxial cables 68 and 68′, respectively. As before, tapering of both the spiral structure and the outer conductors of coaxial cables 68 and 68′ can also be utilized to facilitate the transfer of wave energy between the surface-wave mode and the coaxial mode.

When operating as a parametric amplifier, the various surface-wave transmission lines shown in the several illustrative embodiments of the invention described above are necessarily supportive of an idler wave frequency and a pumping wave frequency as well as a signal wave frequency. In addition, the phase constants for these three propagating waves are preferably related in accordance with Equation 2. To ease the requirements on the surface-wave line and to facilitate the design of a surface-wave amplifier in accordance with the invention, a separate wave path is provided in the embodiment of FIG. 7 for the pumping wave thereby relieving the surface-wave line of the necessity of supporting this frequency wave in addition to the signal and idler waves.

Figure 7:
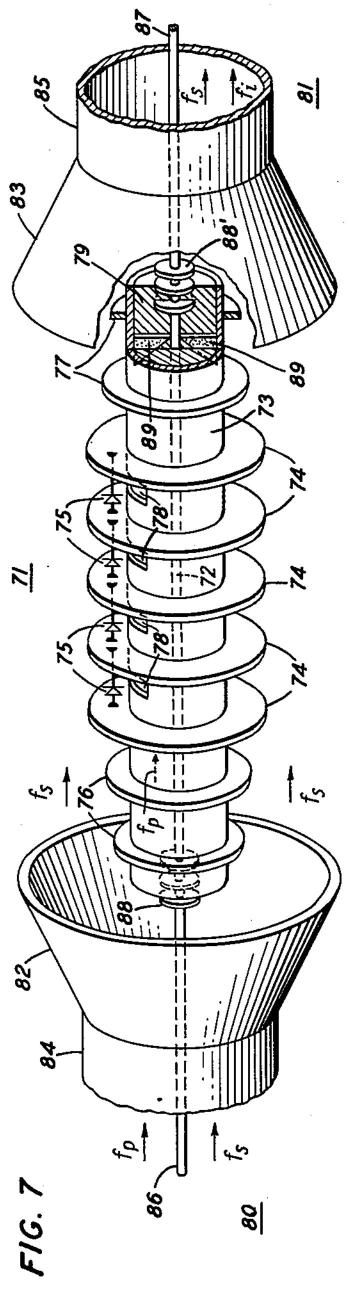
FIG. 7 shows a surface-wave parametric amplifier which has separate transmission paths for the pumping wave and for the signal wave.

In the embodiment of FIG. 7, the amplifier 71 is a composite structure comprising an inner section of coaxial line for the pumping wave and an outer surface-wave line for the signal and idler frequencies. The coaxial line portion of amplifier 71 comprises the conductor 72 which extends longitudinally throughout the length of amplifier 71 and the outer conductive cylinder 73. The surface-wave transmission line portion of amplifier 71 comprises the outer surface of cylinder 73 and the conductive annular ridges mounted thereon including the ridges 74 of substantially uniform diameter between which there are electrically connected the varactor diodes 75 and the end, tapered ridges 76 and 77. Cylinder 73 is provided with slots 78 which comprise the coupling means for coupling pumping wave energy from the inner coaxial line of amplifier 71 to the surface-wave line portion of amplifier 71 and into diodes 75. Low-loss dielectric material 79 for supporting amplifier 71 (such as for example, polyfoam) is located between the inner conductor 72 and the outer cylinder 73.

Amplifier 71 is coupled to input and output coaxial lines 80 and 81 by means of horns 82 and 83 which are the flared ends of the outer conductors 84 and 85 of the coaxial lines. The inner conductors 86 and 87 of coaxial lines 80 and 81, respectively, connect to the inner conductor 72 of amplifier 71.

In operation, signal frequency and pumping frequency wave energy are applied to amplifier 71 from one of the coaxial lines 80. To insure the separation of the two input signals, and their passage along the appropriate wave paths, bandpass filters 88 and 88′, which pass the pumping frequency but are cut-off at the signal and idler frequencies, are inserted at each end of the inner section of coaxial line of amplifier 71. The bandpass filters can be of the coaxial line type as shown in United States Patent No. 2,641,646, or may be any other suitable type of filter known in the art. Thus, pumping wave energy propagates along the coaxial line portion of amplifier 71 whereas the signal frequency is diverted to the surface-wave transmission line portion of amplifier 71. After traversing the amplifier, the amplified signal wave and the idler frequency wave generated in amplifier 71 continue to propagate along coaxial line 81. The remaining pumping wave energy is absorbed within the resistive card 89 terminating the coaxial line portion of amplifier 71.

The advantages of providing a separate wave path for the pumping wave are twofold. First, the surface-wave line need only be designed to propagate the signal and the idler frequencies. Second, the phase constant of the separate wave path can be independently adjusted to satisfy the requirements of Equation 2. For example, in addition to supporting the amplifier structure, the dielectric material 79 in the embodiment of FIG. 7 is selected to provide the preferred loading for the pumping circuit.

Figure 8:
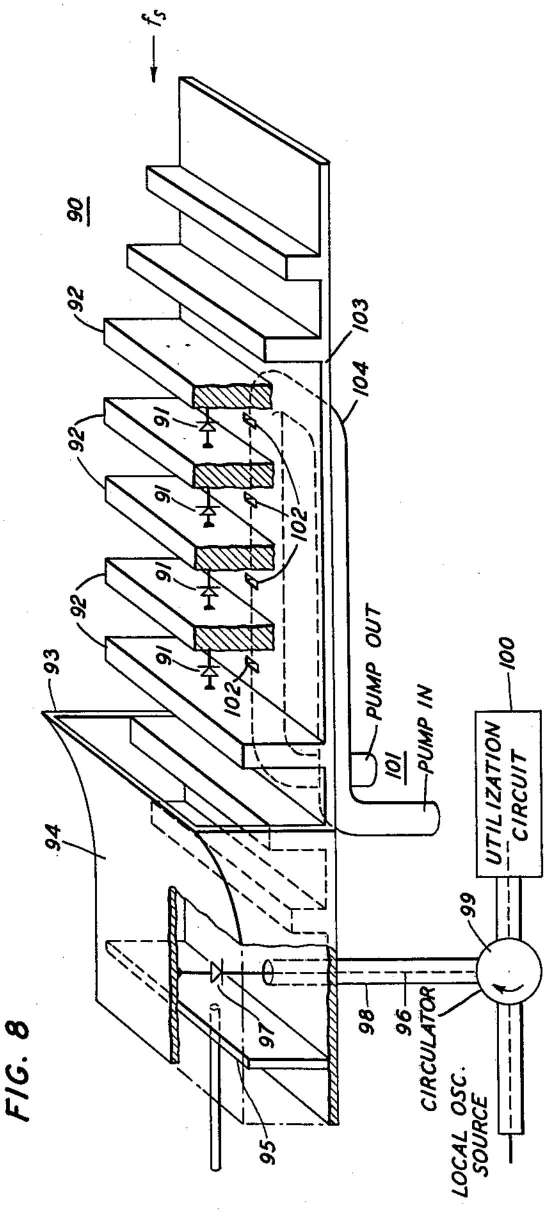
FIG. 8 shows a surface-wave amplifying antenna in accordance with the invention.

The expedient of providing a separate wave path for the pumping wave can also be applied using other types of surface-wave lines and other types of waveguiding structures for the pumping wave as will become apparent upon consideration of the embodiment of FIG. 8.

The surface-wave transmission line has several unique uses beyond its basic use as a mere transmission line. For example, it can be used as an antenna. In the embodiment of FIG. 8 it is more particularly adapted to operate as an amplifying antenna.

The amplifying antenna illustrated in FIG. 8 comprises a length of corrugated surface-wave line 90 of the type described in connection with FIG. 4 with negative resistance elements 91 connected as described heretofore between adjacent metallic ridges 92. One end of line 90 is exposed to radiant wave energy as indicated by an arrow labeled $f_s$ and the other end of line 90 couples through a horn 93 to a section of waveguide 94 which is terminated at its far end in an adjustable short 95. A detecting diode 97 extends transversely across guide 94 with one terminal electrically connected to the upper wall of the guide and the other terminal electrically connected to the center conductor 96 of a coaxial cable 98.

In operation, signal frequency wave energy intercepted by the line 90 functioning as an antenna is amplified due to the action of the negative resistance elements 91 and is applied to the detecting diode 97 along with wave energy at a local oscillator frequency. The local oscillator wave energy is applied to diode 97 through a circulator 99. Intermediate frequency wave energy at the difference frequency between the local oscillator frequency and the signal frequency is applied to the utilization circuit 100 by means of the circulator 99.

When utilized as a parametric amplifier, the amplifying antenna of FIG. 8 must also be supplied with pumping wave energy. This can readily be done by coupling pumping energy from a coaxial line 101 through coupling apertures 102 which extend through the conductive, planar surface 103 of line 90 and the outer conductor 104 of the coaxial line 101. If Esaki diodes or other active elements having an inherent negative resistance are used, the pumping circuit is omitted.

In the embodiment of the invention illustrated in FIGS. 4, 6, 7 and 8 the negative resistance elements are shown operating at zero bias. It is to be understood, however, that in each of these embodiments a biasing circuit, similar to that shown in FIG. 5, but adapted to the particular surface-wave line, can be included where a bias other than zero bias is preferred.

While the various embodiments described above have been characterized as amplifiers, the principles of the invention can be readily applied to other types of devices, such as oscillators and frequency converters. For example, it is known that by increasing the amplitude of the pumping wave above a critical threshold level for the system, a parametric amplifier can be made to oscillate. This is pointed out by H. Suhl in his article "Proposal for a Ferromagnetic Amplifier in the Microwave Region," published in The Physical Review, vol. 106, April 15, 1957. Thus, several of the illustrative embodiments of the invention described herein can be used as an oscillator, the only difference being that no signal wave is applied to the device.

The principles of the invention can also be applied to the so-called "up-converter" type of parametric amplifier. In this type of device the frequency involved in addition to the signal frequency $f_s$ and the pumping frequency $f_p$ is the upper side-band $f_p+f_s$. In contrast, the negative resistance parametric amplifiers described hereinbefore are designed to be supportive of the lower side-band $f_p-f_s$, the so-called "idler" frequency. In their well-known theorem, J. M. Manley and H. E. Rowe have shown that gain in the up-converter is proportional to the frequency ratio $$\frac{f_p+f_s}{f_s}$$

Thus, in the up-converter, the signal frequency is inevitably shifted upward in the amplification process while in the negative resistance parametric amplifier the amplified signal is generally at the same frequency as the input signal or may be at the lower side-band frequency. For further details of the up-converter parametric amplifier, see the above-mentioned article by E. D. Reed.

In applying the principles of the invention to the up-converter, the surface-wave transmission line is designed to support the upper side-band in addition to the signal frequency and the pumping frequency and, preferably, the phase constants for these three waves are related such that $\beta_s+\beta_p=\beta_{p+s}$. In all other respects the operation of the up-converter in accordance with the invention is the same as the negative resistance parametric amplifier described above.

The various embodiments of the invention have been illustrated as being exposed to their surroundings. In a practical situation, however, it may be desirable to protect the amplifier by enclosing it. This can be done by means of a metallic conducting housing or by means of a nonconducting housing. The latter arrangement is recommended, however, since a conducting housing placed about the surface-wave transmission line would form a waveguide capable of supporting spurious modes which, in turn would degrade the operation of the surface-wave amplifier. Typically, the nonconducting housing can be made of a semiconducting carbon impregnated phenol fiber. This material is lossy to high frequency wave energy. To minimize the effect of this lossy material on the surface-wave amplifier, the distance from the surface-wave transmission line to the housing is selected to correspond to a region of low field intensity.

Because the amplifiers herein described are reciprocal in their operation, and hence capable of amplifying in either direction, the usual care must be exercised to properly terminate the amplifiers at both ends in order to minimize reflections. This is usually adequate to insure stable operation. However, if additional precautions are deemed necessary, reciprocal or nonreciprocal lossy elements can be incorporated into the device.

It is, accordingly, understood that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. A traveling wave high frequency amplifier comprising a length of surface-wave transmission line having a plurality of alternate metallic and dielectric regions longitudinally distributed along said line, and means for producing an equivalent negative resistance and inductive reactants between adjacent metallic regions at the outer surface of said line comprising a negative resistance element disposed within successive dielectric regions and electrically connected to the metallic regions adjacent to each of said dielectric regions.

2. The amplifier according to claim 1 wherein each of said negative resistive elements comprises a diode whose voltage-current characteristic includes a negative resistance region and wherein said diode is biased to operate over at least a portion of said region.

3. A surface-wave parametric amplifier comprising a length of surface-wave transmission line having a plurality of alternate metallic and dielectric regions longitudinally distributed along said line, and a voltage sensitive variable capacitance disposed within each of said dielectric regions and electrically connected to the metallic regions adjacent to each of said dielectric regions, said line being supportive of signal wave energy at a freqeuncy $f_s$, of pumping wave energy at a frequency $f_p$ greater than $f_s$, and of side-band wave energy at a frequency $f_p \pm f_s$.

4. A traveling wave high frequency amplifier comprising a planar corrugated surface-wave transmission line having a plurality of longitudinally spaced conductive ridges extending transversely across said line, a negative resistance element electrically connected between successive pairs of adjacent ridges, and means for electromagnetically coupling wave energy to and from said amplifier.

5. A traveling wave high frequency amplifier including a surface-wave transmission line comprising a plurality of conductive disks longitudinally distributed along a common axis perpendicular to the broad surface of said disks, a negative resistance element electrically connected between successive pairs of adjacent disks, and means for coupling electromagnetic wave energy to and from said amplifier.

6. The amplifier according to claim 5 wherein said coupling means comprises a pair of coaxial cables whose center conductors are electrically connected to a first and a last disk of said amplifier and whose outer conductor is flared outward to form a pair of radiating horns.

7. A traveling wave high frequency amplifier for amplifying electromagnetic wave energy at a given frequency including a surface-wave transmission line comprising a conductive spiral structure having a center rod and a longitudinally progressing spiral vane wound about and extending radially from said rod, a plurality of negative resistance elements located along said spiral structure each of which extends parallel to said rod from a first point on said spiral to a second longitudinally spaced corresponding point along said spiral, and means for coupling electromagnetic wave energy to and from said amplifier.

8. The amplifier in accordance with claim 7 wherein said negative resistance elements are longitudinally spaced from each other along said spiral at intervals of at least a quarter wavelength at said given frequency.

9. A parametric amplifier comprising a length of surface-wave transmission line having a plurality of alternate metallic and dielectric regions longitudinally distributed along said line, a voltage sensitive variable capacitance disposed within each of said dielectric regions and electrically connected to the metallic regions adjacent to each of said dielectric regions, said line being supportive of signal wave energy at a frequency $f_s$ and of idler wave energy at a frequency $f_i$, a second wave path supportive of wave energy at a pumping frequency $f_s+f_i$, and means for coupling wave energy between successive points along said second wave path and said dielectric regions of said surface-wave line.

10. The combination according to claim 9 wherein said signal wave energy propagates along said line with phase constant $\beta_s$, wherein said idler wave energy propagates along said line with a phase constant $\beta_i$, and wherein said pumping wave energy propagates along said second wave path with a phase constant $\beta_s+\beta_i$.

11. A parametric amplifier comprising a length of coaxial transmission line supportive of TEM mode wave energy having an inner elongated conductive member and an outer coaxial conductive cylinder surrounding said inner member, means for propagating wave energy in a surface-wave mode disposed along the outer surface of said cylinder comprising a plurality of longitudinally spaced metallic annular ridges mounted along said outer surface, a voltage sensitive variable capacitance electrically connected between successive pairs of adjacent ridges, coupling means for applying wave energy to said amplifier in the TEM mode at a pumping frequency $f_p$ and at a signal frequency $f_s$, wave filtering means for coupling said signal wave energy to the outer surface of said cylinder located between said coupling means and said coaxial line for propagation along the outer surface of said cylinder as a surface wave, said pumping wave continuing along said coaxial line in a TEM mode, and means for coupling said pumping wave to said voltage sensitive capacitance distributed along said outer conductive cylinder.

12. An amplifying antenna comprising a length of surface-wave transmission line having a plurality of alternate metallic and dielectric regions longitudinally distributed along said line, a negative resistance element disposed within successive dielectric regions and electrically connected to the metallic regions adjacent to each of said dielectric regions, said element having a current-voltage characteristic including a negative resistance region, means for biasing said element to operate over at least a portion of said negative resistance region, and means for coupling wave energy from said antenna to a guided wave path located at only one end of said antenna.

13. The combination according to claim 12 wherein said metallic regions comprise spaced conductive ridges mounted along a planar conductive surface and extending across said line in a direction transverse to the direction of propagation along said line, and wherein said guided wave path comprises a hollow conductively bounded rectangular waveguide.

14. An amplifying antenna for receiving and amplifying radiant wave energy at a signal frequency comprising a length of surface-wave transmission line having a plurality of alternate metallic and dielectric regions longitudinally distributed along said line, a voltage sensitive variable capacitance electrically connected between successive pairs of adjacent metallic regions, a guided wave path for propagating pumping wave energy at a frequency higher than said signal wave energy, means for coupling pumping wave energy between successive points along said wave path and said dielectric regions of said surface-wave line, and means for coupling signal wave energy from said antenna to a second guided wave path located at only one end of said antenna.

15. A surface-wave parametric oscillator comprising a length of surface-wave transmission line having a plurality of alternate metallic and dielectric regions longitudinally distributed along said line, a voltage sensitive variable capacitance disposed within said dielectric regions and electrically connected to the metallic regions adjacent to each of said dielectric regions, means for coupling pumping frequency wave energy onto said line at a level greater than the threshold level for said oscillator, and means for extracting wave energy from said oscillator at a lower frequency than said pumping frequency.

References Cited in the file of this patent

UNITED STATES PATENTS

| | | |
|---|---|---|
| 2,760,013 | Peter | Aug. 21, 1956 |
| 3,008,089 | Uhlir | Nov. 7, 1961 |

OTHER REFERENCES

Conrad et al.: "Proceedings of the IRE," May 1960, pages 939–940.